United States Patent
Pelliciari

(10) Patent No.: US 6,673,647 B2
(45) Date of Patent: Jan. 6, 2004

(54) METHOD FOR GROWING A SOLID TYPE II-VI SEMICONDUCTOR MATERIAL

(75) Inventor: Bernard Pelliciari, St Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/168,966

(22) PCT Filed: Nov. 12, 2001

(86) PCT No.: PCT/FR01/03519
§ 371 (c)(1),
(2), (4) Date: Jun. 25, 2002

(87) PCT Pub. No.: WO02/38837
PCT Pub. Date: May 16, 2002

(65) Prior Publication Data
US 2002/0192929 A1 Dec. 19, 2002

(30) Foreign Application Priority Data
Nov. 13, 2000 (FR) .............................. 00 14539

(51) Int. Cl.⁷ .................................. C30B 9/02
(52) U.S. Cl. ........................ 438/95; 438/900; 117/74; 117/78
(58) Field of Search ............... 438/95, 900; 117/21, 117/36, 74, 78

(56) References Cited

U.S. PATENT DOCUMENTS

| 4,190,486 A | * | 2/1980 | Kyle ........................ 438/502 |
| 4,439,266 A | * | 3/1984 | Gentile et al. ........... 117/106 |
| 4,465,527 A | * | 8/1984 | Nishizawa ............... 117/79 |
| 4,526,632 A | * | 7/1985 | Nishizawa et al. ...... 438/501 |
| 5,603,763 A | * | 2/1997 | Taniguchi et al. ....... 117/83 |
| 5,989,337 A | * | 11/1999 | Sato ........................ 117/81 |

FOREIGN PATENT DOCUMENTS

| EP | 0 244 987 | 11/1987 |
| EP | 0 261 647 | 3/1988 |

OTHER PUBLICATIONS

Vere et al.: "Growth of CdTe by solvent evaporation" Journal of Crystal Growth., vol. 72, pp. 97–101 1985.

Mullin et al.: "Crystal growth and characterisation of cadmium telluride . . . " Journal of Crystal Growth., vol. 59, pp. 135–142 1982.

J.F. Butler et al.: "Gamma–and X–ray detectors manufactured from CD1–XZNXTE grown by a high pressure bridgman method" Materials Science and Engineering, vol. B16, No. 1/03, pp. 291–295 Jan. 30, 1993.

\* cited by examiner

*Primary Examiner*—Carl Whitehead, Jr.
*Assistant Examiner*—Stephen W. Smoot
(74) *Attorney, Agent, or Firm*—Oblon, Spivak, McClelland, Maier & Neustadt, P.C.

(57) ABSTRACT

A growth method for a bulk II–VI type semiconductor material, including at least a first component and a second component. The method supplies in a crucible a charge including the components, with proportions of the components being such that the first component is used as a solvent. The crucible is then laced in an open tube reactor. The reactor temperature is then raised to obtain a temperature profile in the reactor ensuring the melting of the charge in the crucible and with the evaporation of the first component beginning, with the pressure inside the reactor being adjusted by the circulation of a gas so that the atmospheric pressure, with the partial pressure of the first component being greater than the partial pressure of the second component.

12 Claims, 2 Drawing Sheets

METHOD FOR GROWING A SOLID TYPE II-VI SEMICONDUCTOR MATERIAL

TECHNICAL DOMAIN

The first invention concerns a growth method for a bulk II–VI type semiconductor material. It is especially applied for obtaining large-sized CdTe or CdZnTe plates. Such plates may be used in the manufacture of elementary or matrix detectors for X and γ imaging.

STATE OF THE PRIOR ART

At the present, the demand for X and γ detectors is becoming ever greater whether it be under the form of elementary detectors or under the form of large surface single dimensional or two-dimensional image recorders. These devices generally use CdTe material (or rather CdZnTe) obtained either using the Travelling Heater Method (THM) with a chlorine doping, or the High Pressure Bridgman method (HPB) with the appropriate doping. In any case, these two methods present a certain number of drawbacks. The uniformity of the electrical properties is not controlled. The reproducibility of a pulling onto the other is not properly ensured. The THM method uses a closed tube and provides ingots limited to a diameter of 2 inches (5.08 cm) and a resistivity limited to $10^9$ Ω.cm. The HPB methods uses an autoclave and provides ingots 4 inches (10.16 cm) in diameter but with a highly random grain size. It requires a high pressure (around 100 atmospheres), which is highly restrictive. Finally, the ingots have a resistivity close to $10^{10}$ Ω.cm, but not uniform along the ingot.

Cadmium telluride may also be obtained by solvent evaporation. The following articles refer to the growth of CdTe crystals following this principle:

"Preparation of CdTe Crystals from Near Stoichiometric and Cd Rich Melt Compositions under Constant Cd Pressure" by M. R. LORENZ, appearing in the Journal of Applied Physics, Vol. 33, No. 11, November 1962, pages 3304–3306;

"Growth of Cadmium Telluride by Solvent Evaporation" by B. LUNN, appearing in the Applied Physics Review, Vol. 12, February 1977, pages 151–154;

"Crystal Growth and Characterisation of Cadmium Telluride: a Modified Solvent Evaporation Technique" by J. B. MULLIN et al, appearing In Journal of Crystal growth, 59 (1982), pages 135–142;

"Growth of CdTe by Solvent Evaporation" by A. W. VERE et al, appearing in Journal of Crystal Growth 72 (1985), pages 97–101.

These articles report on the use of cadmium as a solvent and a crystal growth performed in a sealed quartz tube in which a high-vacuum (less than $10^{-6}$ atmospheres) is achieved beforehand. The need to control the cadmium pressure forces the introduction into the tube (or ampoule), before it is sealed, of a source of cadmium. Due to this fact, LORENZ was forced to develop an experimental system with three temperature zones which cannot be independent and with a displacement of the quartz ampoule. The authors of the other three articles chose a system with two temperature zones which cannot be independent and without any displacement of the quartz ampoule. One zone is centred over the crucible where the growth takes place, the other one over the cadmium source.

Until now, bulk CdTe growth has been done using the so-called closed tube method. The so-called open tube method has been reserved till now for the growth of thin layers of CdTe on a substrate. Bulk crystal growth and the growth of a thin layer on a substrate belong to two different fields of metallurgy for II–VI type semiconductors.

The problem that is posed is therefore how to obtain crystals of II–VI type semiconductor material (especially those made of CdTe and CdZnTe), which is bulky, with a large size and high resistivity, according to a growth method that is not too restrictive.

SUMMARY OF THE INVENTION

The invention allows a solution to be provided for this problem by proposing a growth method allowing the production of plates of bulk II–VI type semiconductor material, with a diameter greater than 10 cm and a very high level of resistivity (greater than $10^9$ Ω.cm).

Therefore the purpose of the invention is a growth method for a bulk II–VI type semiconductor material including at least one first component and one second component, with the procedure including the following steps:

supply in a crucible of a charge including said components, with the proportions of the components in the charge being such that the first component may be used as a solvent, placing of the crucible in a so-called "open tube" reactor, raising of the reactor temperature to obtain a temperature profile in the reactor ensuring the melting of the charge in the crucible and with the evaporation of the first component beginning, with the pressure inside the reactor being adjusted by the circulation of a gas so that the partial pressures of the components will be lower than the atmospheric pressure, with the partial pressure of the first component being greater than the partial pressure of the second component, the temperature profile being such that the melted charge is kept at the growth temperature equal to or slightly higher than its balance temperature and lower than the melting temperature of the desired material, with the temperature profile also being such that the crucible will show a cold point where the germination and the growth of the material takes place, with the reactor also having a cold point thereby allowing the condensation of the solvent.

According to a preferred embodiment, the raising of the temperature is carried out in two successive periods:

a first period during which the temperature profile is such that the charge in the crucible begins to melt and the first component begins to evaporate, with one zone in the reactor located between the crucible and the cold point allowing the condensation of the solvent to be raised to a temperature higher than the temperature in the crucible so as to form a heat barrier;

a second period during which the charge in the crucible is brought up to said growth temperature, with said zone in the reactor located between the crucible and the cold point in the reactor being kept at a temperature lower than the growth temperature in order to allow the condensation of the solvent.

Advantageously, the temperature profile is ensured by a furnace that has two heating zones. Preferentially, the temperature profile is ensure in an upright furnace that has an upper heating zone, corresponding to the position of the crucible, and a lower heating zone located between the position of the crucible and the cold point in the reactor.

The growth temperature, in particular, may be a constant temperature.

The pressure on the inside of the reactor may be adjusted according to the desired evaporation speed for the solvent.

This allows the growth speed for the semiconductor material to be controlled.

The pressure on the inside of the furnace may be adjusted by the circulation of argon.

The charge supplied in the crucible may also include at least one doping impurity, the vapour pressure of which is less than the vapour pressure of the components.

The charge supplied in the crucible may also include at least one doping impurity selected from Ti, V, Cr, Mn, Fe, Co, Ni, Cu, Ga, Ge, Al, In, Ag, Au, Tl, Si, Sn, Pb, Bi, Li, Na, K, Be, Mg and Ca.

At the time of supplying said charge in the crucible, a seed may be introduced in the bottom of the crucible to favour single crystal growth.

The invention is especially applied to obtaining bulk CdTe. In this case, the first component is tellurium and the second component is made of cadmium.

The invention is especially applied again to obtaining bulk CdZnTe. In this case, the semiconductor material also includes a third component that is zinc.

BRIEF DESCRIPTION OF THE DRAWINGS

The invention will be better understood and other advantages and specification will appear when reading the description that appears below, given for the purpose of an example and not limited thereto, accompanied by the drawings attached amongst which.

DETAILED DESCRIPTION OF THE MODES FOR IMPLEMENTING THE INVENTION

The next part of the description will focus on the growth of bulk CdTe. However, the invention is applied to the growth of other semiconductor materials of those II–VI type, including at lest one first component and a second component.

According to the invention, the crystal growth is performed in an open tube reactor which only has one temperature zone to be controlled. In the case of CdTe, it is the tellurium which will be used as a solvent.

Figure 1:
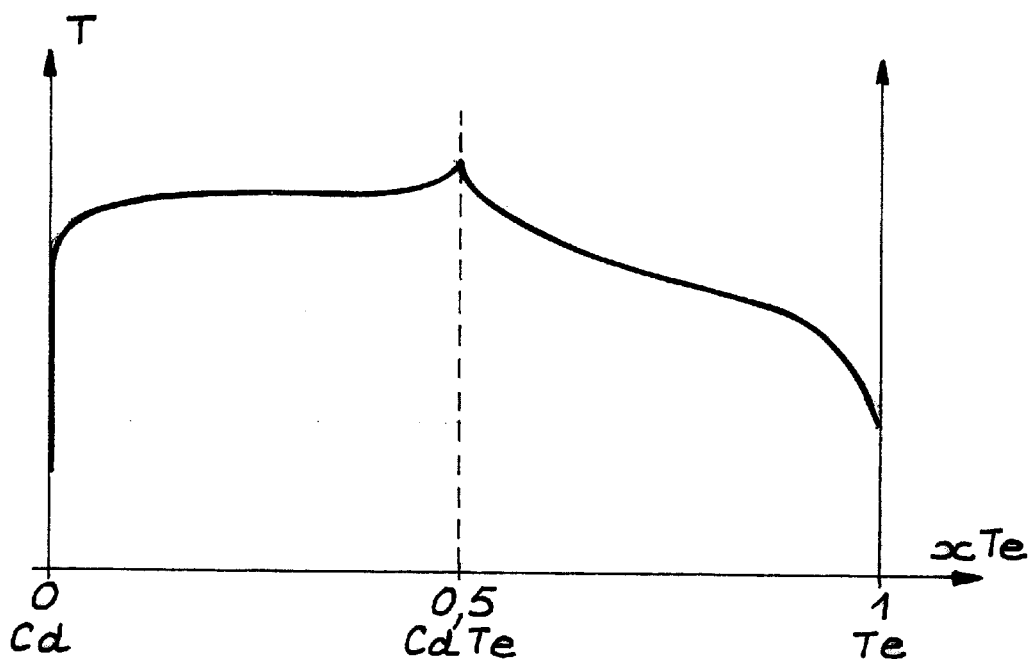
FIG. 1 shows the diagram for the complete phase of a CdTe mixture.

FIG. 1 shows the complete phase diagram for a mixture of CdTe according to the temperature, T. The axis of the abscissa shows the proportion of the components in the mixture. For x=0, there is only pure cadmium. For x=1, there is only pure tellurium. The diagram demonstrates that tellurium may be used more judiciously than cadmium as a solvent for the CdTe because it has a better solubility at all temperatures. Furthermore, the solutions rich in tellurium have much lower partial balance pressures than those placed on the cadmium side. For example, the following relation is given:

$P_{Cd} < P_{Te_2} < 0.18$ atm.

On the cadmium side, the following relation is given:

$P_{Te_2} < P_{Cd} < 6.5$ atm.

According to this example, the partial pressure for cadmium is more than one decade lower on the tellurium side than on the cadmium side. The obligation that arose for the authors of all four articles quoted above to add an extra source of cadmium, and thus to control a second temperature zone, is not acceptable on the tellurium side. This provides one advantage of simplification in the implementation.

The condition of the low partial pressures of Cd and Te set up on the tellurium side offers the possibility of using an open tube instead of a closed tube, which is clearly advantageous for the implementation of the growth method. In this technical field, the expression of closed tube describes a tube that is sealed at the start of the growth operation. The expression of open tube means that the tube used as a reactor is closed off by a flask that allows communication with the outside. In this case, the growth conditions may be modified throughout the growth unlike in the closed tube reactor in which the growth conditions are set at the outset.

The open tube reactor used for the implementation of the method, according to the invention, has a point that is cold enough to condense all the vapour released from the charge located in the hot point. The real temperature of this cold point is however unimportant.

Strictly speaking, a small part of the cadmium is also lost through evaporation but its effect on the composition of the mixture is mainly trivial compared to that caused by the loss of tellurium taking into account the ratio of the partial pressures.

The reactor works under dynamic residual pressure at a reading close to the atmosphere. This allows any contamination from the ambient vapour to be prevented through the impurities released from the wall of the reactor tube or liable to enter the tube through a possible microscopic leak on the level of the seal flask.

The internal pressure must never, under any circumstances, be less than the partial pressures for the cadmium and the tellurium, this being so in order to prevent any boiling of the liquid solution. Nonetheless, its reading may be adjusted in order to reduce or increase the evaporation speed of the tellurium solvent.

The pressure reading at around one atmosphere greatly simplifies the experimental environment in comparison with the HPB method, which requires an autoclave that withstands a pressure of around 100 atmospheres.

The invention allows the use of a reactor that only has one heat zone to control: only the heat zone centred over the crucible containing the charge must be controlled precisely. According to one preferential mode for implementing the invention, the heat zone in the crucible is subject to a temperature the reading of which is lower than the maximum reading for the temperature profile and higher than the melting temperature for the charge so that the latter may become completely liquid. The changeover to the growth step is achieved by the progressive raising of the temperature in this zone to a temperature slightly higher than the temperature $T_{max}$ in the aforementioned profile.

Figure 2C:
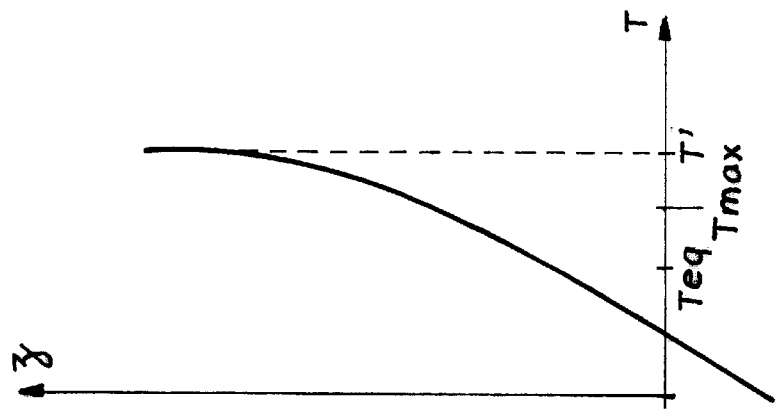
FIGS. 2B and 2C represent the temperature diagrams associated with the device from FIG. 2A.
Figure 2B:
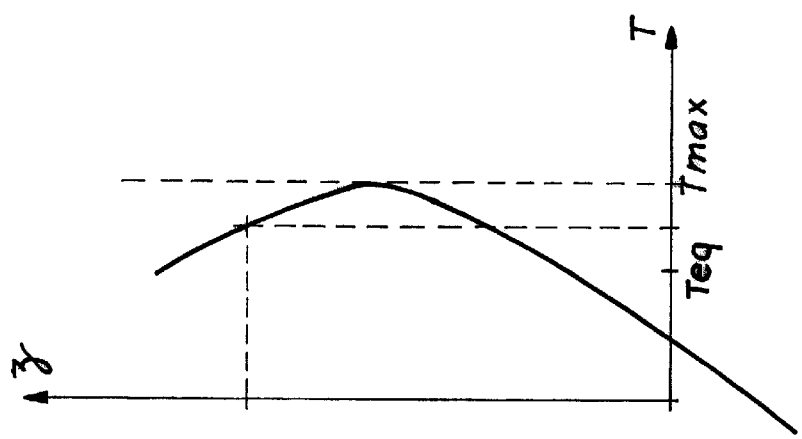
Figure 2A:
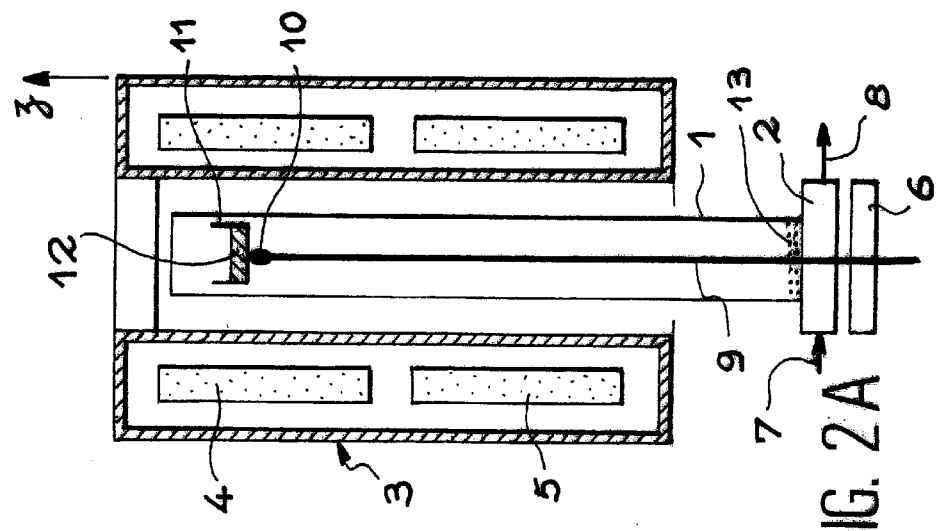
FIG. 2A is a longitudinal section and diagram view of a device for implementing the method according to the invention.

FIG. 2A shows a device for implementing the invention. This device is shown as an upright array. It includes a tube reactor 1 made of quartz, closed at the top and fitted, at the bottom end, with a seal head 2. The tube reactor 1 is put into place from the bottom into an upright furnace 3 that has one upper heating zone 4 and one lower heating zone 5. The seal head 2 also comprises, in addition to a seal flask 6, a connection 7 that may be used as the inlet for the gas as well as a connexction 8 that may be used as a blowout line. The seal flask 6 is fitted in the centre with a line with an O-ring seal allowing a thermocouple 10 to be installed, using a measuring stick 9, to measure the temperature as close as possible to the crucible 11 containing the charge 12.

The position of the crucible 11 in the tube reactor 1 is adjusted by a system of quartz rods (not shown) in such a way as to place the crucible 11 in the upper heating zone 4.

FIG. 2B, associated to FIG. 2A, shows a preferential temperature profile at the time of the melting of the charge placed in the crucible. The axis of the ordinates corresponds to the longitudinal size z of the tube reactor. The axis of the abscissa corresponds to the temperature on the inside of the reactor. This temperature profile, obtained thanks to the heating zones 4 and 5, shows that the temperature in the crucible is lower than the temperature $T_{max}$ in a zone below the crucible. This allows the thermodynamic balance to be maintained between the vapour given off by the crucible and the charge. In effect, the zone brought up to the temperature $T_{max}$ constitutes a thermal block, which prevents the loss of material throughout this step.

At the start of the crystal growth, the T' temperature in the crucible must be at least equal to or slightly higher (by 2 to 10° C., for example) than the balance temperature $T_{eq}$ for the composition chosen for mixing the initial tellurium and cadmium. The temperature profile in FIG. 2C shows that at the outset of the crystal growth, the heat block no longer exists. The tellurium solvent may therefore leak out towards the coldest point in the reactor, that is to say towards the seal head 2 where a deposit of tellurium 13 is formed.

The presence of a gas in the reactor, kept at a pressure close to the atmosphere does not change the direct for transporting the solvent at all. This gas may be hydrogen, a mixture of hydrogen and argon, argon helium, which are inert for the tellurium. The circulation of this gas, thanks to the connections 7 and 8, at a flow rate of 400 cm³/minute is designed to ensure its renewal.

Figure 3:
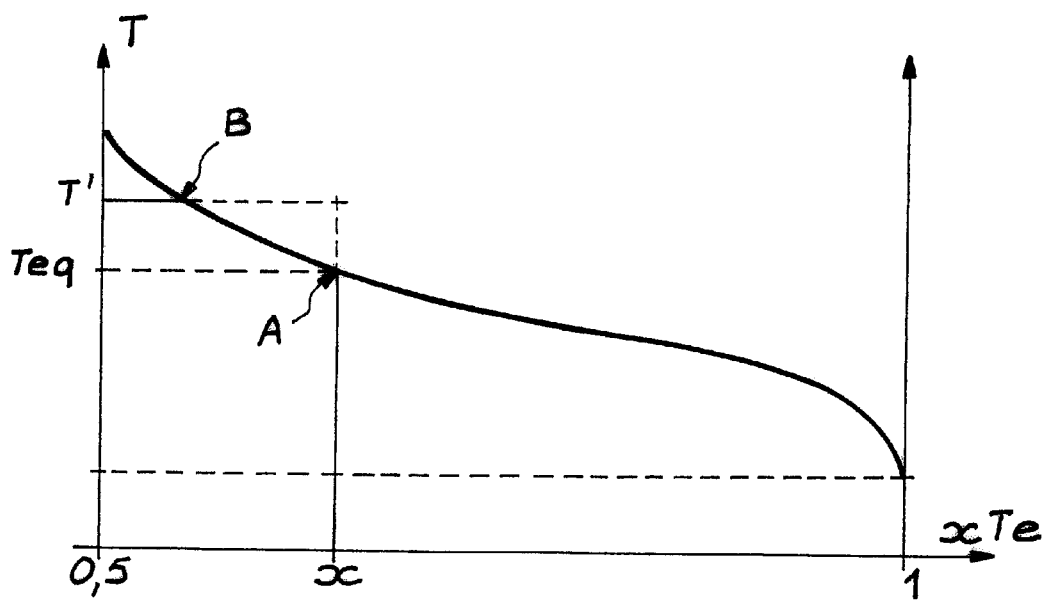
FIG. 3 represents a partial phase diagram, on the tellurium side, of a CdTe mixture illustrating the growth of a CdTe crystal according to the invention.

FIG. 3 represents a partial phase diagram, on the tellurium side, for a mixture of CdTe. In order to obtain a CdTe crystal, the charge in the crucible presents the composition imposed by the abscissa x. Since the phase diagram is not perfect, the balance temperature for a given composition (marked by point A) is uncertain. For this reason, the crucible is brought up to a temperature T' slightly higher than the balance temperature. At this temperature the whole mixture is liquid. The solution whose composition is represented by point A on the diagram, loses some tellurium through evaporation and is therefore enriched in cadmium. On the phase diagram, the latter corresponds to a displacement from point A corresponding to the balance temperature $T_{eq}$ to point B corresponding to the temperature T' set by the upper heating zone in the furnace. At point B, the composition can no longer change, since the temperature is blocked. Thus the supersaturation is created that is required for the germination thereby starting off the crystal production in the CdTe composition. This germination and the crystal growth start off at the bottom of the crucible where a cold point is ensured thanks to a slight temperature gradient (see FIG. 2C).

Thus the CdTe growth progresses until all of the solvent has evaporated. It stops as soon as there is no more tellurium solvent. The return to ambient temperature may then be started off by a scheduled drop in the temperature in the heating zones.

Using this method, the crystal growth is carried out at a constant temperature based on a solution at a constant temperature and with mechanical displacement of any kind. The thermal stability conditions are therefore optimal and constant throughout the growth step. Further, it is possible to add doping impurities at the beginning. These impurities must present a very low vapour pressure not to be evaporated in the solvent. For the II–VI type materials, the impurities that may be used are the following: Ti, V, Cr, Mn, Fe, Co, Ni, Cu, Ga, Ge, Al, In, Ag, Au, Tl, Si, Sn, Pb, Bi, Li, Na, K, Be, Mg and Ca.

Moreover, it may be advisable to introduce a seed into the bottom of the crucible, at the time of the charging, to encourage the production of single crystals. This seed may be an oriented single crystal, for example, some CdTe or any other substrate that is insoluble in the solution.

Furthermore, the experimental scientist may aim for exactly one crystallised CdTe thickness by defining the weight of the component dissolved at the outset and by adjusting the weight of the solvent in order to match the concentration of the charge selected. It is, in fact, the amount of the component dissolved which defines the desired thickness.

In any case, it should be noted that the working principle described above is only valid in the temperature range in which the tellurium flux emitted by the liquid charge is greater than the cadmium flux, thus generating a variation of the charge composition ($xTe_{liquid}$ decreases) such that the associated balance temperature tends to increase. It is therefore necessary that the partial pressure of the solvent should be higher than that of the other component in this temperature range.

On the side rich in tellurium, this situation is only true if the balance temperature of the initial CdTe binary charge is lower than around 1,040° C. Above that temperature and up to 1,090° C. (considered to be the melting point for CdTe), it is the inverse phenomenon which arises: the flux of cadmium leaving the charge is greater than the flux of tellurium, which generates a change in the composition of the charge ($xTe_{liquid}$ increases) such that the associated balance temperature tends to drop, which does not cause any driving force for the crystallisation.

The charge, the composition of which at the balance temperature is equal to around 1,040° C., has the specific nature of possessing equal flows of tellurium and cadmium. It must also be excluded from the procedure as described by the invention.

In the case of the third component of compound CdZnTe, the liquid solutions must also have an initial composition such that the balance temperature will tend to increase through the loss of tellurium (the flow of tellurium is greater than the flux of cadmium).

An example is now given for the precise implementation. The crucible is charged with a solution of 66.63 g of Cd and Te also containing the appropriate doping elements. The composition of the solution is xTe=0.62 and corresponds to a balance temperature of 975° C. The crucible is placed into the upright furnace with two heating zones, illustrated by FIG. 2A. A temperature profile such as the one shown in FIG. 2B is ensured during the temperature rise. Then the upper heating zone is adjusted so as to ensure a temperature of 975° C. at the bottom of the crucible as well as a slight temperature profile of 1° C./cm increasing at the level of the crucible.

The volume of the solution charged represents a liquid flask around 3 mm thick. Therefore it may be said, in the low temperature gradient imposed, the solution is almost isothermal.

During the whole duration of the experiment (that is, 15 hours), the temperature of 975° C. is maintained. The internal pressure in the reactor is set at 0.85 atm. and kept constant by the circulation of argon at a rate of 400 cm³/ minute. At the end of these 15 hours, a scheduled lowering of the ambient temperature in both zones in the furnace brings the temperature in the crucible down to ambient temperature, with the latter containing a disk of CdTe measuring around 65 mm in diameter and weighing 53.37 g. Thus, 13.26 g are lost in the vapour phase, which corresponds practically to the evaporation of the tellurium solvent.

The CdTe disk obtained this way then undergoes a slight mechanical smoothing of both its sides. A crystalline structure appears made up by several long grains. Its thickness if then 2.5 mm.

A first electrical characterisation made with the help of gold contacts, shows a highly homogeneous resistivity of $10^{10}$ $\Omega$.cm on the CdTe disk. Furthermore, a photosensitive effect characterises this material. These two criteria are essential for the proper working of X and Y ray detectors. On an X-ray pulse of 100 kV, 29 mA, 500 ms, the aforementioned material, which is polarised under a voltage of 36 volts, provides a perfectly square signal of 12 mV, without any trailing effect. This material is therefore totally adapted for detecting X-ray radiation. Similar performance levels are expected under y-radiation for a thicker material.

What is claimed is:

1. A growth method for a bulk II–VI type semiconductor material, including at least a first component and a second component, the method comprising:

supplying in a crucible a charge including said components, with the proportions of the components in the charge being such that the first component is used as a solvent;

placing the crucible in an open tube reactor;

raising the reactor temperature to obtain a temperature profile in the reactor ensuring the melting of the charge in the crucible and with the evaporation of the first component beginning, with the pressure inside the reactor being adjusted by the circulation of a gas so that the partial pressures of the components will be lower than the atmospheric pressure, with the partial pressure of the first component being greater than the partial pressure of the second component, the temperature profile being such that the melted charge is kept at a growth temperature equal to or slightly higher than its balance temperature and lower than the melting temperature of the desired material, with the temperature profile also being such that the crucible will show a cold point where the germination and the growth of the material takes place, with the reactor also having a cold point thereby allowing for the condensation of the solvent.

2. Method according to claim 1, wherein the rise in the temperature is performed in two successive periods:

a first period during which the temperature profile is such that the charge in the crucible begins to melt and the first component begins to evaporate, with one zone in the reactor located between the crucible and the cold point allowing for the condensation of the solvent to be raised to a temperature higher than the temperature in the crucible so as to form a heat barrier;

a second period during which the charge in the crucible is brought up to said growth temperature, with said zone in the reactor located between the crucible and the cold point in the reactor being kept at a temperature lower than the growth temperature in order to allow for the condensation of the solvent.

3. Method according to claim 2, wherein the temperature profile is ensured by a furnace that has two heating zones.

4. Method according to claim 3, wherein the temperature profile is ensured in an upright furnace, which has an upper heating zone, corresponding to the position of the crucible, and a lower heating zone located between the position of the crucible and the cold point in the reactor.

5. Method according to claim 1, wherein said growth temperature is a constant temperature.

6. Method according to claim 1, wherein the pressure on the inside of the reactor is adjusted according to the evaporation speed desired for the solvent.

7. Method according to claim 1, wherein the pressure on the inside of the reactor is adjusted by the circulation of argon.

8. Method according to claim 1, wherein said charge supplied in the crucible also includes at least one doping impurity whose vapour pressure is lower than the vapour pressure of the components.

9. Method according to claim 8, wherein said charge supplied in the crucible also includes at least one doping impurity chosen from: Ti, V, Cr, Mn, Fe, Co, Ni, Cu, Ga, Ge, Al, In, Ag, Au, Tl, Si, Sn, Pb, Bi, Li, Na, K, Be, Mg and Ca.

10. Method according to claim 1, wherein, at the time of supplying said charge in the crucible, a seed is introduced in the bottom of the crucible to favour single crystal growth.

11. Method according to claim 1, wherein the first component is tellurium and the second component is made of cadmium.

12. Method according to claim 11, wherein the semiconductor material also includes a third component that is zinc.

* * * * *